US008344611B2

(12) United States Patent
Im et al.

(10) Patent No.: US 8,344,611 B2
(45) Date of Patent: Jan. 1, 2013

(54) OXYFLUORIDE PHOSPHORS AND WHITE LIGHT EMITTING DIODES INCLUDING THE OXYFLUORIDE PHOSPHOR FOR SOLID-STATE LIGHTING APPLICATIONS

(75) Inventors: Won-Bin Im, Goleta, CA (US); Ram Seshadri, Goleta, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 93 days.

(21) Appl. No.: 12/816,939

(22) Filed: Jun. 16, 2010

(65) Prior Publication Data
US 2010/0314993 A1 Dec. 16, 2010

Related U.S. Application Data

(60) Provisional application No. 61/187,411, filed on Jun. 16, 2009.

(51) Int. Cl.
*H05B 33/14* (2006.01)
*H01L 33/50* (2010.01)
*H01L 33/52* (2010.01)

(52) U.S. Cl. .............. 313/501; 428/691; 252/301.4 H; 313/512; 313/486

(58) Field of Classification Search .............. 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25; 252/646, 301.4 R
See application file for complete search history.

(56) References Cited

U.S. PATENT DOCUMENTS

| 3,014,877 A | 12/1961 | Ranby et al. |
| 6,538,371 B1 | 3/2003 | Duggal et al. |
| 6,608,332 B2 | 8/2003 | Shimizu et al. |
| 6,657,379 B2 | 12/2003 | Ellens et al. |
| 6,717,349 B2 | 4/2004 | Wang et al. |

(Continued)

FOREIGN PATENT DOCUMENTS

EP 1296376 3/2003

(Continued)

OTHER PUBLICATIONS

The Journal of Solid State Chemistry, ISSN 0022-4596, vol. 172, No. 1, Apr. 2003, Academic Press, A.K. Prodjosantoso et al, pp. 89-94.*

(Continued)

*Primary Examiner* — Mariceli Santiago
*Assistant Examiner* — Donald Raleigh
(74) *Attorney, Agent, or Firm* — Gates & Cooper LLP

(57) ABSTRACT

A blue-green emitting $Ce^{3+}$-activated oxyfluoride phosphor for use with a light emitting diode (LED) in solid state lighting applications. The blue-green emitting $Ce^{3+}$-activated oxyfluoride phosphor is represented as:

$$(Sr_{1-x-y}AE_y)_3(Al_{1-z}T_z)O_4F:Ce^{3+}_x$$

wherein $0 < x \leq 0.3$, $0 \leq y \leq 1$, AE includes at least one element selected from alkaline earth metals on the periodic table, for example, Mg, Ca and Ba, $0 \leq z \leq 1$, and T includes at least one atom selected from Al, B, Ga, and In. The blue-green emitting $Ce^{3+}$-activated oxyfluoride phosphor may be combined with another phosphor to generate the white light. Specifically, the present invention provides for white light generation by combining the blue-green emitting $Ce^{3+}$-activated oxyfluoride phosphor with either a near-ultraviolet (UV) LED and red emitting phosphor, or with a near-UV LED and a red-yellow phosphor.

18 Claims, 9 Drawing Sheets

U.S. PATENT DOCUMENTS

| | | | |
|---|---|---|---|
| 6,717,353 | B1 | 4/2004 | Mueller et al. |
| 7,045,826 | B2 | 5/2006 | Kim et al. |
| 7,332,106 | B2 | 2/2008 | Yoshino et al. |
| 7,497,973 | B2 | 3/2009 | Radkov et al. |
| 2001/0001207 | A1 | 5/2001 | Shimizu et al. |
| 2005/0212397 | A1 | 9/2005 | Murazaki et al. |
| 2007/0241666 | A1 | 10/2007 | Jang et al. |
| 2009/0085467 | A1 | 4/2009 | Jang et al. |
| 2009/0174310 | A1 | 7/2009 | Vogt et al. |
| 2009/0212314 | A1 | 8/2009 | Im et al. |
| 2010/0096974 | A1* | 4/2010 | Setlur et al. .................. 313/487 |
| 2011/0101272 | A1 | 5/2011 | Im et al. |

FOREIGN PATENT DOCUMENTS

| | | |
|---|---|---|
| EP | 1296383 | 3/2003 |
| EP | 1696016 | 8/2006 |
| KR | 10-2007-0098275 | 9/2007 |
| WO | 98/05078 | 2/1998 |
| WO | 2005052087 | 6/2005 |
| WO | 2006/081803 A1 | 8/2006 |
| WO | 2007/018345 A1 | 2/2007 |
| WO | 2007/041563 | 4/2007 |

OTHER PUBLICATIONS

Chen, Y. et al., "High efficient and low color-temperature white light-emitting diodes with Tb3Al5O12:Ce3+ phosphor," Applied Physics Letters 91, 0711117 (2007).

Greenham, N. et al., "Measurement of absolute photoluminescence quantum efficiencies in conjugated polymers," Chemical Physics Letters 241 (1995) 89-96.

Haranath, D. et al., "Enhanced luminescence of Y3Al5O12:Ce3+ nanophosphor for white light-emitting diodes," Applied Physics Letters 89, 173118 (2006).

Im, W. et al., "A yellow-emitting Ce3+ phsophor, La1-xCexSr2AlO5, for white light-emitting diodes," Applied Physics Letters 93, 091905 (2008).

Im, W. et al., "New oxyfluoride phosphors for white LED," Presentation Slides, Annual Review 2009, Nov. 5, 2009.

Im, W. et al., "Sr2.975-xBaxCe0.025AlO4D: a highly efficient green-emitting oxyfluoride phosphor for solid state white lighting," Chem. Mater. 2010, 22, 2842-2849.

Jang H. et al., "Enhancement of red spectral emission intensity of Y3Al5O12:Ce3+ phosphor via Pr co-doping and Tb substitution for the application to white LEDs," Journal of Luminescence 126 (2007) 371-377.

Kasuya, R. et al., "Characteristic optical properties of transparent color conversion film prepared from YAG:Ce3+ nanoparticles," Applied Physics Letters 91, 111916 (2007).

Li, Y. et al., "Luminescence properties of Eu2+-activated alkaline-earth silicon-oxynitride MSi2O2-deltaN2+2/3delta (M = Ca, Sr, Ba): a promising class of novel LED conversion phosphors," Chem. Mater. 2005, 17, 3242-3248.

Lu, C. et al., "Cerium-ion-doped yttrium aluminum garnet nanophosphors prepared through sol-gel pyrolysis for luminescent lighting," Applied Physics Letters, vol. 80, No. 19, May 13, 2002, 3608.

Park, J. et al., "White light-emitting diodes of GaN-based Sr2SiO4:Eu and the luminescent properties," Applied Physics Letters, vol. 82, No. 5, Feb. 3, 2003, 683.

Piao, X. et al., "Preparation of CaAlSiN3:Eu2+ phosphors by the self-propagating high-temperature synthesis and their luminescent properties," Chem. Mater. 2007, 19, 4592-4599.

Prodjosantoso, A. et al., "Cation and anion ordering in the layered oxyfluorides Sr3-xAxAlO4F (A = Ba, Ca)," Journal of Solid State Chemistry 172 (2003) 89-94.

Saradhi, M. et al., "Photoluminescence studies on Eu2+-activated Li2SrSiO4—a potential orange-yellow phosphor for solid-state lighting," Chem. Mater. 2006, 18, 5267-5272.

Seshadri, R. et al., "Novel phosphors for solid state lighting," Presentation Slides, Annual Review 2009, Nov. 5, 2009.

Vogt, T. et al., "Sr3MO4F (M = Al, Ga)—a new family of ordered oxyfluorides," Journal of Solid State Chemistry 144, 228-231 (1999).

Xie, R. et al., "Eu2+-doped Ca-alpha-SiAlON: a yellow phosphor for white light-emitting diodes," Applied Physics Letters, vol. 84, No. 26, Jun. 28, 2004, 5404.

International Search Report, International application No. PCT/US2010/038852, International filed Jun. 16, 2010, date of mailing Aug. 24, 2010.

Van Krevel, "Luminescence properties of rare earth doped alpha-SiAlON materials" on New Rare-Earth Doped M-Si-AL-O-N Materials, Jan. 1, 2000, pp. 145-157, XP008060386.

Van Krevel, et al., "Luminescence Properties of Terbium-, Cerium-, or Europium-Doped alpha-Sialon Materials", Journal of Solid State Chemistry, vol. 165, Apr. 26, 2002, pp. 19-24, XP002563952.

Xie, et al., "Photoluminescence of Cerium-Doped alpha-SiAlON Materials", Journal of American Ceramic Society, vol. 87, No. 7, Jul. 1, 2004, pp. 1368-1370, XP002344461.

Xie, et al., "Photoluminescence of Rare-Earth-Doped Ca-[alpha]-SiAlON Phosphors: Composition and Concentration Dependence", Journal of American Ceramic Society, vol. 88, No. 10, Aug. 19, 2005, pp. 2883-2888, XP002563951.

Im, Won Bin et al., "A green-emitting phosphor :Sr2.975-xBaxCe0.025AlO4F with high quantum efficiency for solid state white lighting applications", Solid State Lighting and Energy Center, Materials Department and Materials Research Laboratory, University of California, Santa Barbara, CA 93106, Manuscript, pp. 15-17.

Blasse et al., "Fluorescence of Eu2-activated silicates," Philps. Res. Repts. 23, 1968, pp. 189-200.

Drofenik et al., "Refinement of the Sr2EuFeO5 and SrEuAlO5 structures," Acta Cryst., B35, 1979, pp. 1059-1062.

Glasser et al., "Silicates M3SiO5 I. Sr3SiO5," Acta Cryst., 18, 1965, pp. 453-454.

Im et al. "La1-x-0.025Ce0.025Sr2+xAl1-xSixO5 solid solutions as tunable yellow phosphors for solid state white lighting," J. Mater. Chem, 19, 2009, pp. 1325-1330.

Im et al., "LaSr2AlO5, a Versatile Host Compound for C3+-Based Yellow Phosphors: Structural Tuning of Optical Properties and Use in Solid-State White Lighting". Chemistry of Materials, vol. 21, No. 13, 2009, pp. 2957-2966.

Im, et al., "Sr2.975-xBaxCe0.025AlO4F: a Highly Efficient Green-Emitting Oxyfluoride Phosphor for Solid State White Lighting". Chemistry of Materials, vol. 22, No. 9, 2010, pp. 2842-2849.

Jang et al., "Yellow-emitting Sr3SiO5:Ce3+, Li+ phosphor for white-light-emitting diodes and yellow-light-emitting diodes". Applied Physics Letters, vol. 90, 2007, pp. 041906-1 to 041906-3.

Park et al., "Investigation of strontium silicate yellow phosphors for white light emitting diodes from a combinatorial chemistry," Applied Physics Letters, 87, 2005, pp. 031108-1-031108-3.

Park et al., "Embodiment of the warm white-light-emitting diodes by using a Ba2+ codoped Sr3SiO5: Eu phosphor," Applied Physics Letters, 88, 2006, pp. 043511-1-043511-3.

International Search Report and Written Opinion of the International Searching Authority mailed on May 4, 2009, for International application No. PCT/US2009/035425, International filing dated Feb. 27, 2009.

International Search Report and Written Opinion of the International Searching Authority mailed on Dec. 13, 2010 for International Application No. PCT/US10/52505, International filing date Oct. 13, 2010.

\* cited by examiner

OXYFLUORIDE PHOSPHORS AND WHITE LIGHT EMITTING DIODES INCLUDING THE OXYFLUORIDE PHOSPHOR FOR SOLID-STATE LIGHTING APPLICATIONS

CROSS-REFERENCE TO RELATED APPLICATIONS

This application claims the benefit under 35 U.S.C. Section 119(e) of and commonly assigned U.S. Provisional Patent Application Ser. No. 61/187,411 filed on Jun. 16, 2009, by Won-Bin Im, Ram Seshadri and Steven P. DenBaars, entitled "OXYFLUORIDE PHOSPHORS AND WHITE LIGHT EMITTING DIODES INCLUDING THE OXYFLUORIDE PHOSPHOR FOR SOLID-STATE LIGHTING APPLICATIONS";

which application is incorporated by reference herein.

This application is related to the following co-pending and commonly-assigned U.S. patent applications:

U.S. Provisional Application Ser. No. 61/256,830, filed on Oct. 30, 2009, by Won-Bin Im, Ram Sheshadri, and Steven P. DenBaars, entitled "SOLID SOLUTION PHOSPHORS BASED ON OXYFLUORIDE AND WHITE LIGHT EMITTING DIODES INCLUDING THE PHOSPHORS FOR SOLID STATE WHITE LIGHTING APPLICATIONS,"; and U.S. Utility application Ser. No. 12/394,492, filed Feb. 27, 2009, by Won-Bin Im, Ram Seshadri and Steven P. DenBaars, entitled "YELLOW EMITTING PHOSPHORS BASED ON $Ce^{3+}$-DOPED ALUMINATE AND VIA SOLID SOLUTION FOR SOLID-STATE LIGHTING APPLICATIONS," now U.S. Pat. No. 8,163,203, issued Apr. 24, 2012, which application claims the benefit under 35 U.S.C. Section 119(e) of U.S. Provisional Patent Application Ser. No. 61/067,297, filed on Feb. 27, 2008, by Won-Bin Im, Ram Seshadri and Steven P. DenBaars, entitled "YELLOW EMITTING $CE^{3+}$-DOPED ALUMINATE PHOSPHOR AND WHITE LIGHT EMITTING DIODES INCLUDING $Ce^{3+}$-DOPED ALUMINATE PHOSPHOR FOR SOLID-STATE LIGHTING APPLICATIONS,"; and U.S. Provisional Patent Application Ser. No. 61/074,281, filed on Jun. 20, 2008, by Won-Bin Im, Ram Seshadri and Steven P. DenBaars, entitled "NEW YELLOW-EMITTING PHOSPHORS VIA SOLID SOLUTION AND WHITE LIGHT EMITTING DIODES INCLUDING NEW YELLOW-EMITTING PHOSPHOR FOR SOLID-STATE LIGHTING APPLICATIONS,";

which applications are incorporated by reference herein.

BACKGROUND OF THE INVENTION

1. Field of the Invention

This invention relates to oxyfluoride phosphors, and white light emitting diodes (LEDs) including the oxyfluoride phosphor for solid state light applications.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

In order to generate white light from LEDs, there are basically two strategies: the first approach is to mix different red, green, and blue components from LED chips, and the second approach is to down-convert the emission from a blue LED or ultraviolet (UV) LED to a longer wavelength using a phosphor.

For generating white light, most current commercial LED lamps employ the second approach, namely using yellow emitting $YAG:Ce^{3+}$ phosphors excited by blue InGaN diodes, because of its superiority in terms of cost, efficiency and simplicity of fabrication [1-3]. Further information on the second approach can be found in PCT International Patent Application No. WO98/05078 [4], which is incorporated by reference herein.

However, $YAG:Ce^{3+}$ phosphors have relatively weak light emitting intensity in the red spectral region and, consequently, it is difficult to obtain a good color rendering index (CRI) [5-7]. In addition, the output color from $YAG:Ce^{3+}$ phosphors is strongly dependent on temperature and current, which will become a significant problem in high-power LEDs [8].

To overcome these drawbacks, and also to avoid issues associated with intellectual property, there are extensive efforts worldwide to develop new yellow emitting phosphors for blue-pumped LED applications [9-12], as well as to optimize existing systems. Unfortunately, with the exception of $YAG:Ce^{3+}$, there are few phosphor materials for use with long UV or blue excitation sources. Up to now, no competing yellow phosphor has been found to replace the $YAG:Ce^{3+}$ phosphor.

Thus, there is a need in the art for the development of new phosphors for solid-state lighting, especially phosphors with high efficiency and improved color rendering properties in the red region, that can be manufactured easily and at low cost, with better thermal stability. The present invention satisfies that need.

SUMMARY OF THE INVENTION

To overcome the limitations in the prior art described above, and to overcome other limitations that will become apparent upon reading and understanding the present specification, the present invention discloses a phosphor for use with an LED in solid state lighting applications, wherein the phosphor and LED emit white light (e.g., in combination with one or more additional phosphors), as well as a method for creating the phosphor.

In particular, the phosphor comprises a blue-green emitting $Ce^{3+}$-activated oxyfluoride phosphor, which is represented as:

$(Sr_{1-x-y}AE_y)_3(Al_{1-z}T_z)O_4F:Ce^{3+}_x$ wherein $0 < x \leq 0.3$, $0 \leq y \leq 1$, AE includes at least one element selected from alkaline earth metals of the periodic table, for example, Mg, Ca and Ba, $0 \leq z \leq 1$, and T includes at least one atom selected from Al, B, Ga, and In.

The present invention discloses an apparatus for solid state lighting applications, comprising an LED for emitting light; and a phosphor optically coupled to the LED, wherein the phosphor comprises the $Ce^{3+}$-activated oxyfluoride phosphor.

The blue-green emitting $Ce^{3+}$-activated oxyfluoride phosphor may be combined with another phosphor to generate the white light. Specifically, the present invention provides for white light generation by combining the blue-green emitting $Ce^{3+}$-activated oxyfluoride phosphor with either a near-UV LED and red emitting phosphor, or with a near-UV LED and a red-yellow phosphor. Thus, the phosphor may comprise a first phosphor that is mixed with a second phosphor to create a phosphor mixture that is optically coupled to the LED, and wherein the phosphor mixture absorbs the light emitted from the LED and emits a white light in response thereto. The LED may emit light at a near-UV wavelength, the first phosphor may be a blue-green light emitting phosphor, and the second phosphor may be a red light emitting phosphor. The LED may emit light at a near-UV wavelength, the first phosphor may be a blue-green light emitting phosphor, and the second phosphor may be a yellow-red light emitting phosphor.

The phosphor may include an absorbing ion as a sensitizer and charge compensator that absorbs exciting radiation and transfers it to an activator in the phosphor that emits light having a wavelength longer than a wavelength of the exciting radiation.

The present invention further discloses a phosphor composition, comprising Sr, AE, Al, and F and doped with $Ce^{3+}$ as an activator, and having a structure and composition such that the phosphor emits blue-green light with a quantum efficiency when excited or optically pumped with violet, ultraviolet light or blue light, wherein the quantum efficiency is greater than a quantum efficiency of a YAG:$Ce^{3+}$ phosphor excited with the violet, the ultraviolet, or the blue light.

The phosphor's structure and composition may produce an X-ray diffraction (XRD) spectrum as shown in FIG. 5. The phosphor's structure and composition may be as shown in FIG. 3a. The phosphor's emission and excitation spectra may be as shown in FIG. 6, FIG. 7, or FIG. 8.

A photoluminescence (PL) intensity emitted by the phosphor, when excited or optically pumped by an LED emitting a peak intensity of light at a wavelength in response to a drive current, may be greater than a PL intensity emitted by the YAG:Ce phosphor excited by the LED emitting the light having the wavelength in response to the drive current.

A luminous efficiency of the phosphor may be at least 10 μm/W, when excited by an LED emitting a peak intensity of light at a wavelength in response to a drive current.

The phosphor may comprise a $Ce^{3+}$-activated oxyfluoride phosphor represented as $(Sr_{1-x-y}AE_y)_3(Al_{1-z}T_z)O_4F:Ce^{3+}_x$, wherein x, y, and AE may be such that the phosphor emits light having a peak intensity at a blue, blue-green, or green wavelength when excited by ultraviolet or blue radiation.

The phosphor may emit light having a first peak intensity at a first wavelength between 450 and 450 nm, when excited by an LED emitting a second peak intensity of light at a second wavelength in response to a drive current, the phosphor emitting the light having the first wavelength with a full width at half maximum (FWHM) that is broader than a FWHM of light emitted by the YAG:$Ce^{3+}$ phosphor excited by the LED emitting the second peak intensity of light at the second wavelength in response to the drive current.

The method for creating the $Ce^{3+}$-activated oxyfluoride phosphor described above includes the steps of mixing stoichiometric amounts of carbonate or oxide of alkaline earth metals (AE), alumina ($Al_2O_3$), fluorine ($SrF_2$, $BaF_2$, $CaF_2$, $NH_4F$, $CeF_3$, $AlF_3$ and etc.), and cerium oxide ($CeO_2$) to create a mixture, and heating the mixture (e.g., in a reduction atmosphere to a temperature between 500° C. and 1700° C.) to create the $Ce^{3+}$-based oxyfluoride phosphor. In addition, flux materials may be added to the mixture.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention relates to a phosphor and a white light emitting diode (LED) including the phosphor. In particular, the phosphor comprises a blue-green emitting $Ce^{3+}$-activated oxyfluoride phosphor, which is represented as:

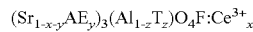

wherein $0<x\leq 0.3$, $0\leq y\leq 1$, AE includes at least one element selected from alkaline earth metals on the periodic table, for example, Mg, Ca and Ba, $0\leq z\leq 1$, and T includes at least one atom selected from Al, B, Ga, and In.

This host lattice was first reported by Kennedy et al. in 1999 and 2003 [13, 14]. However, the present invention is the first to use this phosphor for solid-state lighting applications, in combination with other phosphors and devices. Specifically, the present invention provides for white light generation by combining either a near-UV LED (emitting a peak intensity at a wavelength ($\lambda_{max}$)=395 and 405 nm) and red emitting phosphor, or a near-UV LED and a red-yellow phosphor, with the blue-green emitting $Ce^{3+}$-activated oxyfluoride phosphor of the present invention.

The phosphor based upon the present invention shows a broad band emission from 420 to 600 nm when it was excited by the existing GaN-based long wavelength UV LED. The LED using the phosphor of the present invention is expected to provide high efficiency and good color rendering properties with various phosphor combinations for white lighting when it is applied to an LED for solid-state lighting and/or as a backlight source for an liquid crystal display (LCD).

Technical Description

Apparatus

Figure 1:
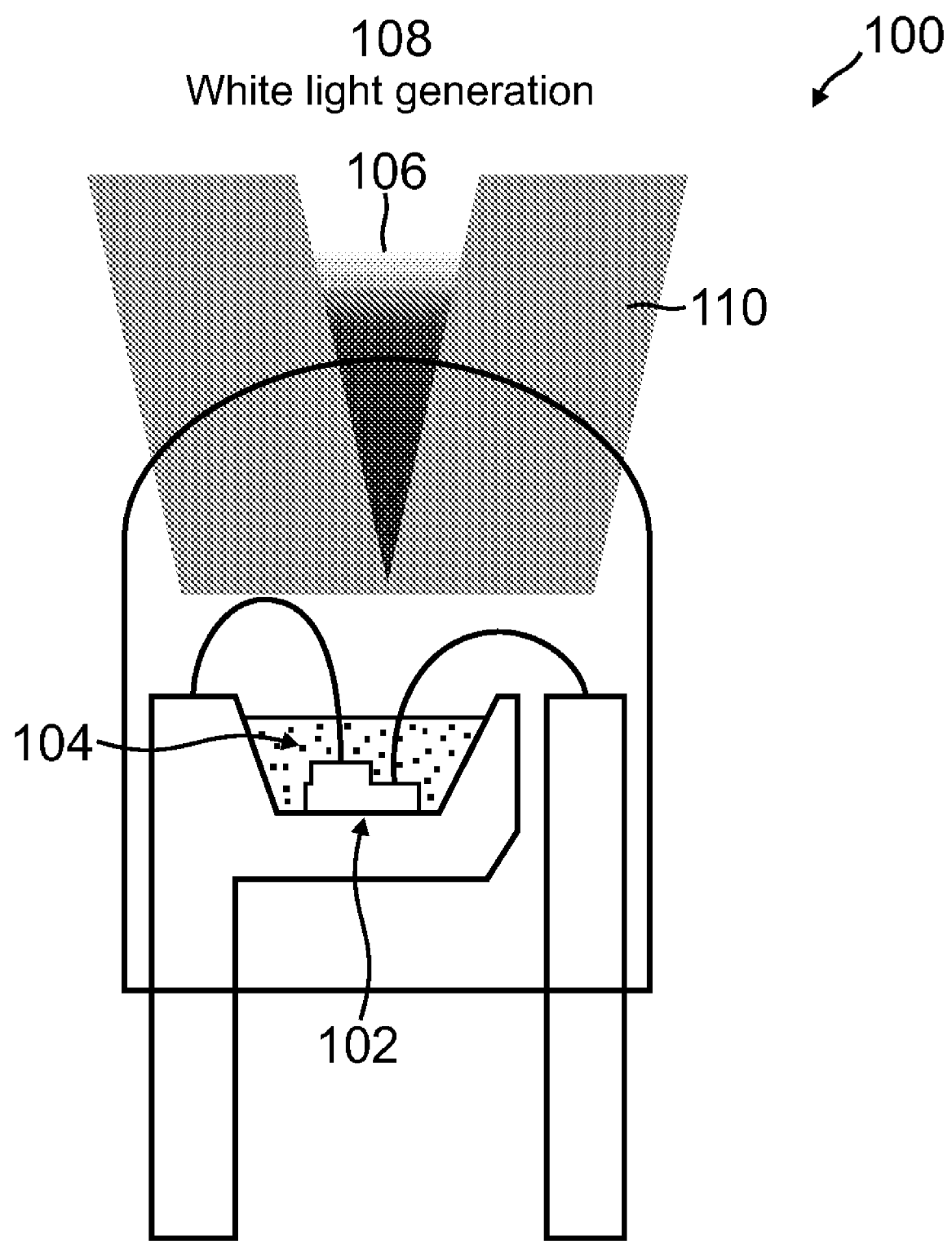
FIG. 1 is a cross-sectional schematic diagram of the structure of a white LED according to one embodiment of the present invention.

FIG. 1 is a schematic view of an apparatus 100 for solid state lighting applications, e.g., a white LED using a $Ce^{3+}$-activated oxyfluoride phosphor with various phosphor combinations, according to one embodiment of the present invention.

The apparatus 100 comprises an LED 102 for emitting light; and a phosphor 104 optically coupled to the LED 102. For example, the white LED 100 may be fabricated by using a near-UV LED chip 102 having a dominant emission wavelength of 395 nm (or 405 nm) 106 with a $Ce^{3+}$-activated oxyfluoride phosphor 104. The phosphor 104 may comprise a $Ce^{3+}$-activated oxyfluoride phosphor represented as:

wherein $0<x\leq0.3$, $0\leq y\leq1$, AE includes at least one element selected from alkaline earth metals, $0\leq z\leq1$, and T includes at least one atom selected from Al, B, Ga, and In.

In order to obtain a white light emitting LED 100 for white light generation (emitting white light 108), the phosphor 104 may be a blue-green emitting oxyfluoride phosphor combined with either a red light emitting phosphor (blue-green+ red), a yellow-red light emitting phosphor (blue-green and yellow-red) or yellow light 110 and red light emitting phosphors (blue-green+yellow+red). For this purpose, there are many numbers of different applications.

Process

Figure 2:
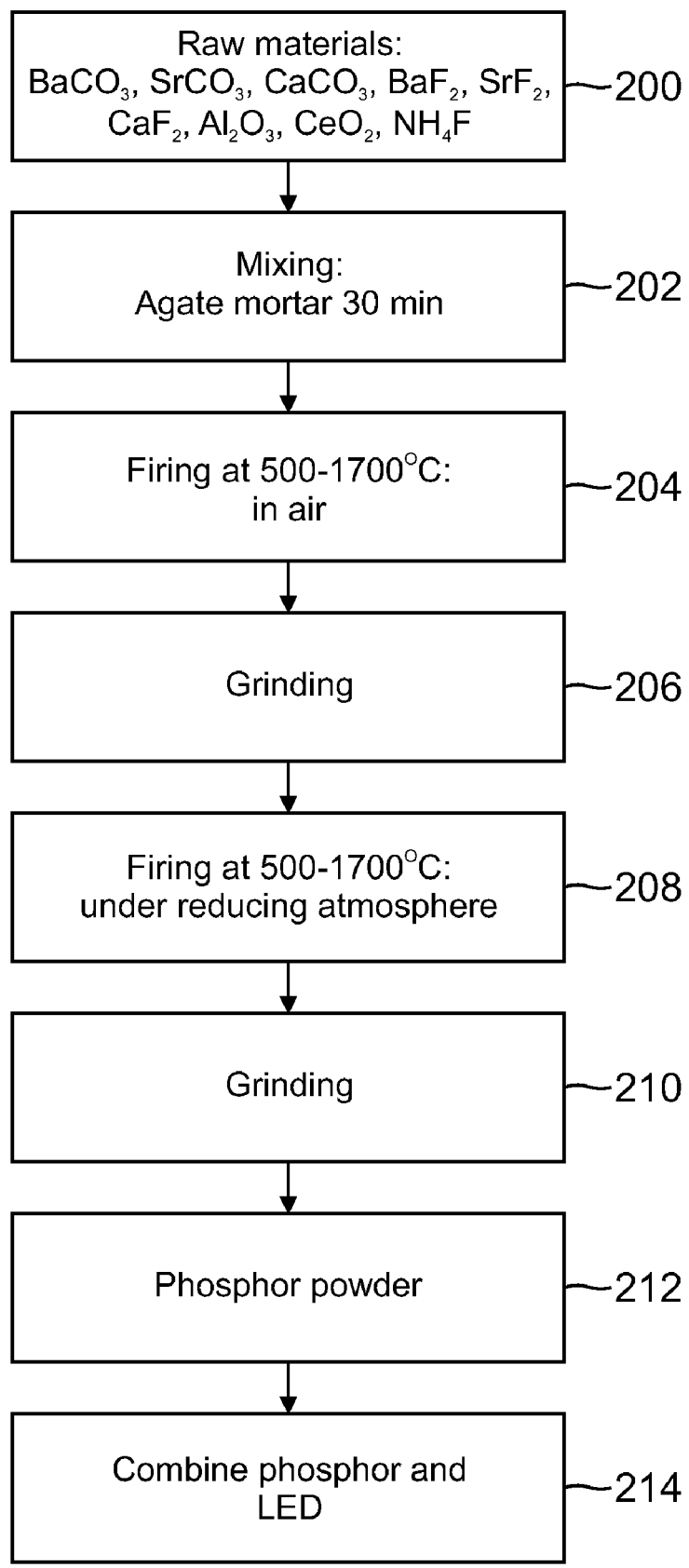
FIG. 2 is a flowchart illustrating the steps of a process for creating a $Ce^{3+}$-activated oxyfluoride phosphor according to one embodiment of the present invention.

FIG. 2 is a flowchart illustrating a process for creating the $Ce^{3+}$-activated oxyfluoride phosphor according to one embodiment of the present invention. In order to synthesize $(Sr_{1-x-y}AE_y)_3(Al_{1-z}T_z)O_4F:Ce^{3+}_x$ phosphor samples, $CaCO_3$, $CaF_2$, $SrCO_3$, $SrF_2$, $BaCO_3$, $BaF_2$, $Al_2O_3$, $AlF_3$, $NH_4F$, $H_3BO_3$, $Ga_2O_3$, $In_2O_3$, $Sc_2O_3$, $CeF_3$, and $CeO_2$ are selected and used as raw materials in stoichiometric amounts (Block 200). In particular, carbonates or oxides of alkaline earth metals (AE), alumina ($Al_2O_3$) and cerium oxide ($CeO_2$) may be used. Many materials may be used as a fluorine source, including $CaF_2$, $SrF_2$, $BaF_2$, $NH_4F$, $CeF_3$, and $AlF_3$.

The raw materials are then mixed (mixing step, Block 202) to form a mixture using e.g., an agate mortar for 30 minutes, and subsequently heated (heating the mixture or firing step, Block 204) to between 500° C. and 1700° C. in air. The mixing step (Block 202) may further comprise adding flux materials such as $BaF_2$ to the mixture. The heating of the mixture may be in a reduction atmosphere.

The resulting materials are then subject to a first grinding step (Block 206), followed by a second firing or heating step (Block 208) where the materials are heated to between 500° C. and 1700° C. It is preferable that, in the second firing step, a reduction atmosphere be provided by supplying a nitrogen mixture gas whose hydrogen content is 2 to 25% by volume on the basis of the volume of the mixture gas. In order to enhance the optical properties of the phosphor, it is possible to heat two or more times to provide high crystallinity.

Following the second heating step, the resulting materials are subject to a second grinding step (Block 210).

The end result of the process is the phosphor powder of the present invention (Block 212). The resulting phosphor may comprise Sr, AE, Al, and F and be doped with $Ce^{3+}$ as an activator, and may have a structure and composition such that the phosphor emits blue-green light with a quantum efficiency (QE), which is the ratio of the total number photons input to the phosphor to the total number of photons exiting the phosphor, when excited with violet, ultraviolet light or blue light, wherein the quantum efficiency is greater than a quantum efficiency of a YAG:$Ce^{3+}$ phosphor excited with the violet, the ultraviolet, or the blue light.

The resulting phosphor powder may comprise a $Ce^{3+}$-activated oxyfluoride phosphor represented as

wherein $0<x\leq0.3$, $0\leq y\leq1$, AE includes at least one element selected from alkaline earth metals, $0\leq z\leq1$, and T includes at least one atom selected from Al, B, Ga, and In. The elements selected from the alkaline earth metals comprise Mg, Ca and Ba.

The phosphor may include an absorbing ion as a sensitizer and charge compensator that absorbs exciting radiation and transfers it to an activator in the phosphor that emits light having a wavelength longer than a wavelength of the exciting radiation.

Steps may be added as desired. For example, an additional step may further comprise Block 214, representing combining the phosphor of Block 212 with an LED and also possibly one or more additional phosphors.

The quantum efficiency of the phosphor of Block 212 may be greater than 81%, at least 90% or 95% (near 100%), when excited by e.g., 400 nm (wavelength of peak intensity) light from an InGaN LED, for example.

The PL intensity emitted by the phosphor, when excited by an LED (e.g., with an InGaN quantum well active layer) emitting a peak intensity of light at a wavelength (e.g., 405 nm) in response to a drive current (e.g., 2-30 mA) or voltage bias, may be greater (e.g., at least 150% greater) than a PL intensity emitted by the YAG:Ce phosphor excited by the LED emitting the light having the same wavelength in response to the same drive current.

The luminous efficiency of the phosphor may be at least 10 lm/W (or at least 25 μm/W or at least 30 μm/W), when excited by an LED emitting a peak intensity of light at a wavelength (e.g., 405 nm) in response to a drive current (e.g., between 2-30 mA). For example, blue-green emission at 30 μm/W has been achieved for excitation by an LED at 405 nm wavelengths with 20 mA drive current.

The phosphor may emit light having a first peak intensity at a first wavelength between 450 and 500 nm, when excited by an LED emitting a second peak intensity of light at a second wavelength between 500 and 550 nm in response to a drive current, the phosphor emitting the light having the first wavelength with a full width at half maximum (FWHM) that is broader than a FWHM of light emitted by the YAG:$Ce^{3+}$ phosphor excited by the LED emitting the second peak intensity of light at the second wavelength in response to the drive current.

x, y, and AE may be such that the phosphor emits light having a peak intensity at blue, blue-green, or green wavelengths (e.g., 450 nm-550 nm) when excited by radiation having a peak wavelength in the ultraviolet or blue part of the spectrum (e.g., 350 nm-450 nm, e.g., emitted from the LED). Quantum efficiency is defined and measured as in [14].

Block 214 further represents combining the phosphor of Block 212 with one or more additional phosphors, e.g., to generate white light. For example, the phosphor 104 illustrated in FIG. 1 may comprise a first phosphor that is mixed with a second phosphor to create a phosphor mixture that is optically coupled to the LED, and wherein the phosphor mixture absorbs the light emitted from the LED and emits a white light in response thereto. The LED may emit light at a near-UV wavelength (~370-400 nm), the first phosphor may be a blue-green light emitting phosphor, and the second phosphor may be a red light (e.g., 620-750 nm) emitting phosphor. Alternatively, the LED may emit light at a near UV wavelength, the first phosphor may be a blue-green light emitting phosphor, and the second phosphor may be a yellow-red (e.g., 570 nm-750 nm) light emitting phosphor.

Steps may be omitted or varied as desired. For example, the method may comprise mixing stoichiometric amounts of carbonate or oxide of alkaline earth metals (AE), alumina ($Al_2O_3$), fluorine ($SrF_2$, $BaF_2$, $CaF_2$, $NH_4F$, $CeF_3$, $AlF_3$ and etc.), and cerium oxide ($CeO_2$) to create a mixture (Block 202); and heating the mixture to create the $Ce^{3+}$-based oxyfluoride phosphor (Block 204 and/or Block 208).

Structure

Figure 3A:
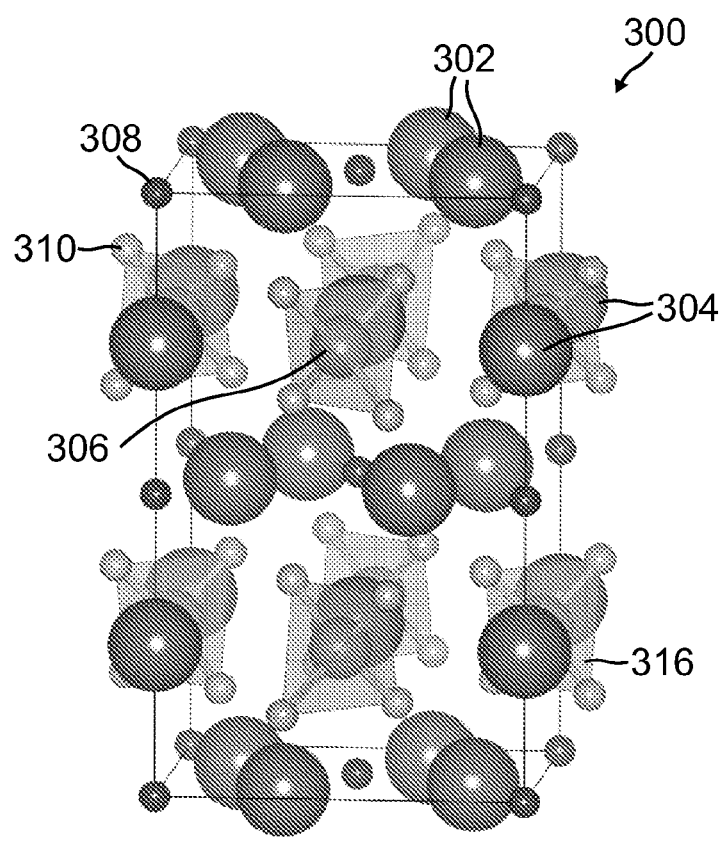
FIG. 3a is a unit cell representation of $Sr_3AlO_4F$.

FIG. 3a is a unit cell 300 representation of $Sr_3AlO_4F$. In the unit cell (Z=4) of $Sr_3AlO_4F$, the cell shows 8h sites 302 and 4a sites 304 fully occupied by Sr atoms (Sr1, 2), and a 4b site 306 occupied by Al atoms, wherein the 4b site 306 is between 4a sites 304, the 4a sites 304 and 4b sites 306 are in planes or layers between planes or layers containing the 8h sites 302. Fluorine (F) atoms are distributed over a 4c site 308 and a 16l site 310 is occupied by Oxygen (O) atoms.

Figures 3B, 3C:
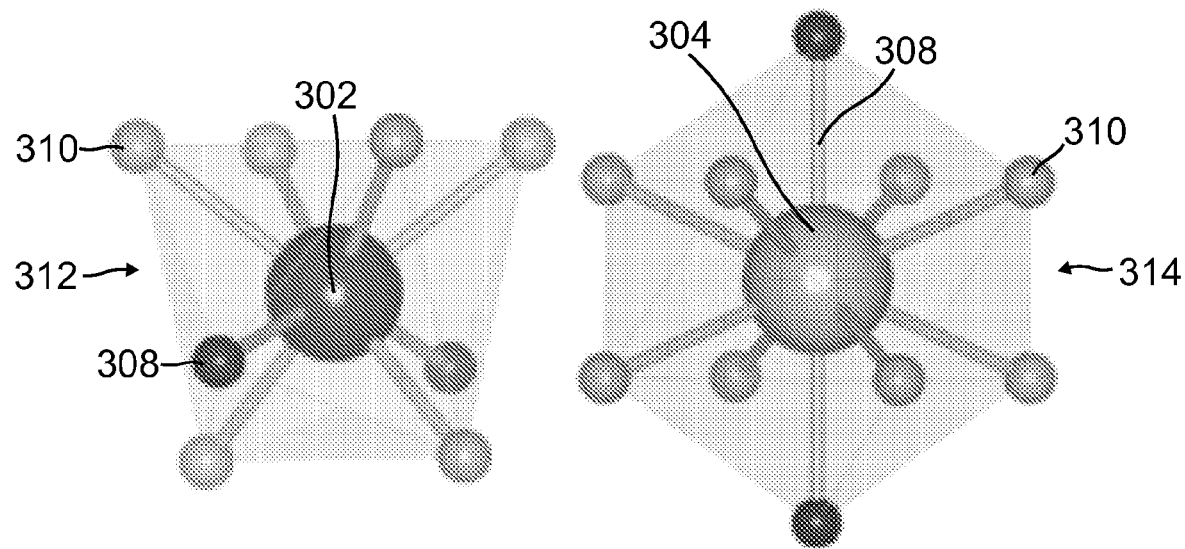
FIG. 3b illustrates a polyhedron geometry of $SrlO_6F_2$.
FIG. 3c illustrates a polyhedron geometry of $Sr2O_8F_2$.

FIG. 3b illustrates a polyhedron 312 geometry of $Sr1O_6F_2$, with Sr1 at the 8h site 302 at the center of the polyhedron 312, the O atoms at the 16l site 310, the F atoms at the 4c site 308, wherein the 16l site 310 and the 4c 308 site are at vertices of the polyhedron 312.

FIG. 3c illustrates a polyhedron 314 geometry of $Sr2O_8F_2$, with Sr2 at the 4a site 304 at the center of the polyhedron 314, the O atoms at the 16l site 310, the F atoms at the 4c site 308, wherein the 16l site 310 and the 4c 308 site are at vertices of the polyhedron 314.

The $CeO_6F_2$ polyhedron consists of two $F_1$ atoms on the 4c site 308 and six $O_1$ atoms on the 16l site 310, where the latter are shared by four $AlO_4$ tetrahedra 316 on the adjacent layers. The polyhedral 316 geometry around the Ce atom can be described as a distorted square antiprism, in which the two $F_1$ atoms 308 are displaced away from each other, while residing on the mirror plane.

The 8h site 302 and 4a site 304 may be populated by Sr or Ce atoms (with Ce substituting Sr). The AE, such as Ba, may take the place of Sr2 on the 4a site 304 and/or Sr1 on the 8h site 302, although the AE is more likely to substitute for Sr2 on the 4a site 304. The AE may increase the bonding of the Sr2 so that the host is stabilized (without Ba, Sr2 may be underbonded as compared to Sr1). However, the Ce may occupy two sites 4a and 8h, which generates two peaks in the PL spectrum [15].

Figure 4:
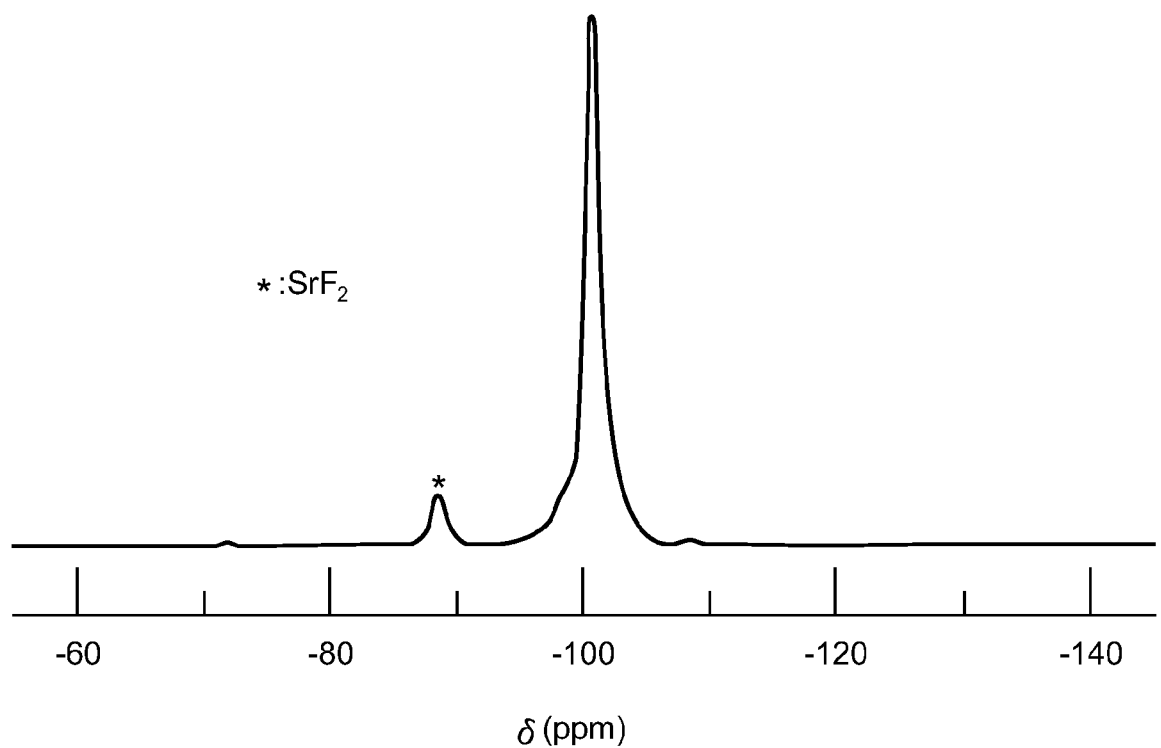
FIG. 4 is a Fluorine magic angle spinning (MAS) Nuclear Magnetic Resonance (NMR) spectra of $Sr_{2.975}Ce_{0.0255}$ showing the chemical shift in parts per million (ppm) and relative amounts of Fluorine (F) in the $SrF_2$ impurity phase and the $Sr_3AlO_4F$ phase.

The Sr, AE, Al, and F may be ordered such that the phosphor is an isostructural compound. The phosphor's structure and composition may have a unit cell as shown in FIG. 3a. The F atoms may be well ordered as illustrated in FIG. 4.

First Embodiment

Figure 5:
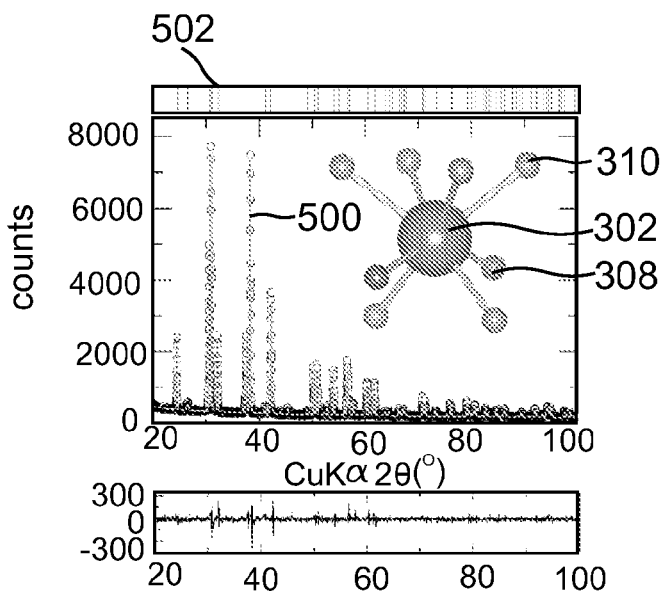
FIG. 5 (top graph) is a Rietveld refinement of a powder XRD (x-ray diffraction) profile of $Sr_{2.975}AlO_4F:Ce^{3+}_{0.255}$, showing a calculated fit (solid line) to the XRD observed data (circles), wherein the expected reflection positions are shown and the inset shows the coordination geometry of the $CeO_6F_2$ polyhedron therein, plotting counts versus $CuK\alpha 2\theta$ in degrees (°), and FIG. 5 (bottom graph) shows the difference between the calculated fit and the XRD observed data in the top graph of FIG. 5.

The single phase of a $Sr_{2.975}AlO_4F:Ce^{3+}_{0.025}$ phosphor sample was obtained, as shown by the XRD spectrum in the top graph of FIG. 5. The phosphor sample is a powder having a tetragonal structure with a space group I4/mcm, and its cell parameters were about a=b=6.7720(1) and c=11.1485(2) Å based on the Rietveld refinement with XRD data. Also shown is the Sr1 at the 8h site 302, F atoms 308 and O atoms 310. Thus, the phosphor may have a structure and composition that produces an XRD spectrum as shown in FIG. 5. The calculated fit in FIG. 5 (solid line) to the experimental data (circles) is based on crystal structure refinements based on the a structural model employing the Rietveld method. The expected reflection positions 502 are also shown. The bottom graph of FIG. 5 represents the difference profile between the calculated fit 500 and the observed XRD data (circles) in the top graph of FIG. 5.

Figure 6:
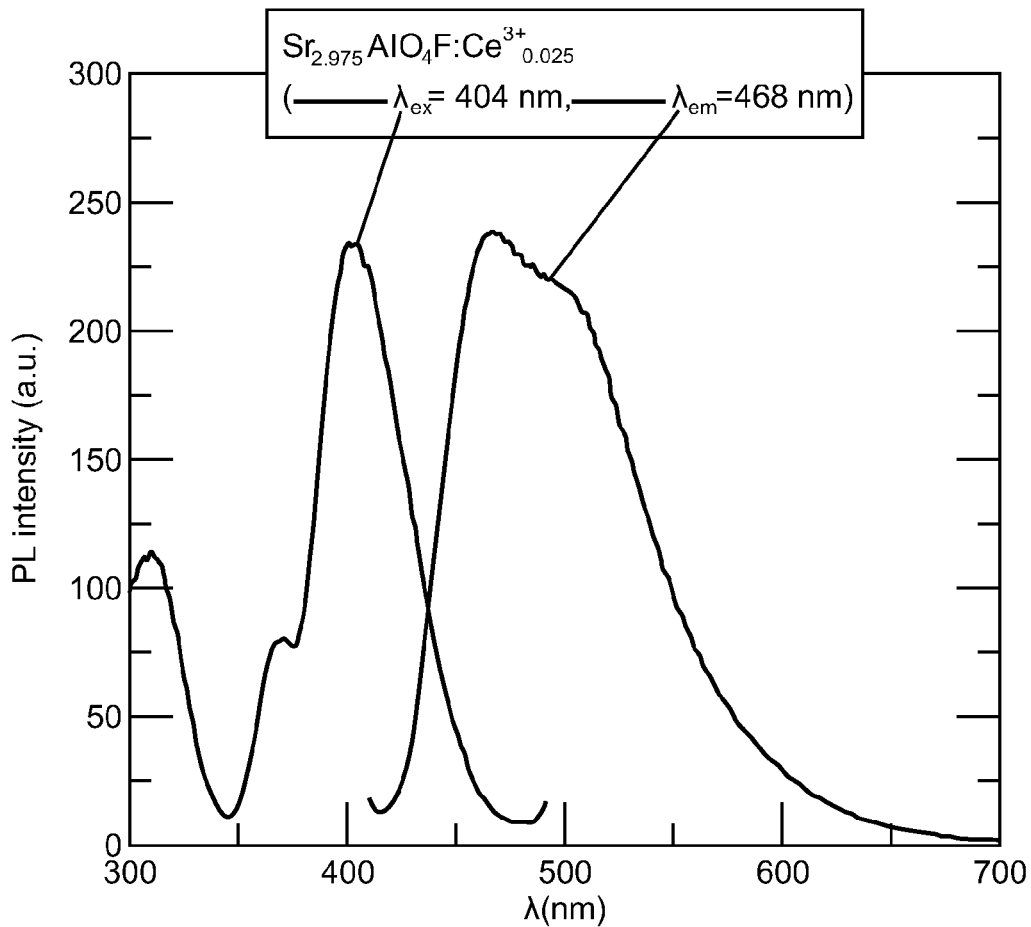
FIG. 6 is a graph that shows the excitation ($\lambda_{ex}$) and emission ($\lambda_{em}$) spectra of $Sr_{2.975}AlO_4F:Ce^{3+}_{0.025}$ at room temperature, plotting PL intensity (arbitrary units, a.u) as a function of excitation and emission wavelength ($\lambda$) in nanometers (nm).

The luminescent property of this $Sr_{2.975}AlO_4F:Ce^{3+}_{0.025}$ composition has a broad excitation band $\lambda_{ex}$ from 300 nm to 460 nm with a maximum at $\lambda_{ex}$=404 nm, as shown in FIG. 6. The composition has an emission band centered at $\lambda_{em}$=468 nm with a relatively broad FWHM value (~100 nm) in comparison with the YAG:$Ce^{3+}$ phosphor.

Second Embodiment

Figure 7:
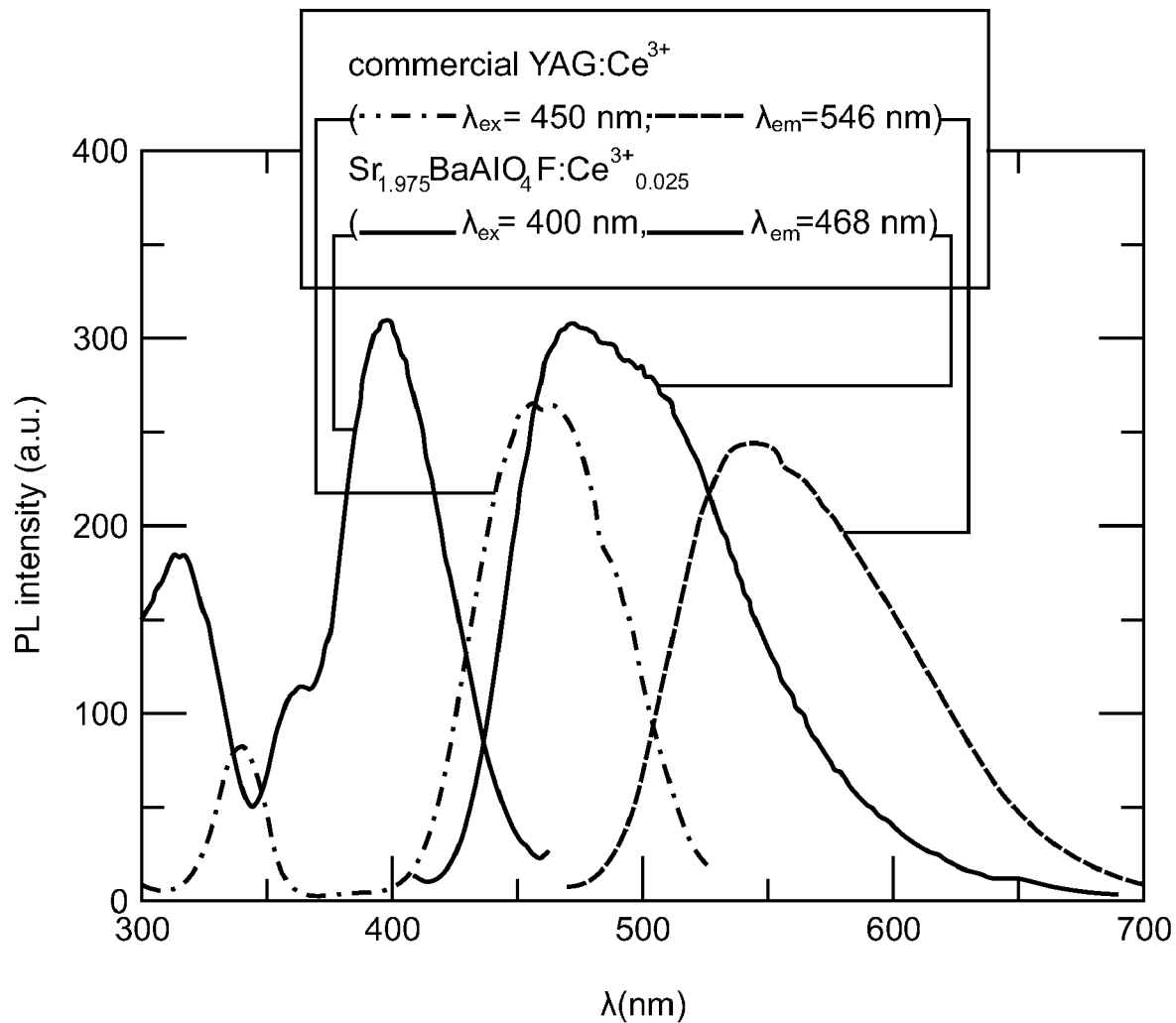
FIG. 7 is a graph that shows the excitation ($\lambda_{ex}$) and emission ($\lambda_{em}$) spectra of a commercial YAG:$Ce^{3+}$ phosphor compared with data for $Sr_{1.975}BaAlO_4F:Ce^{3+}_{0.025}$ at room temperature, plotting PL intensity in a.u. as a function of excitation $\lambda$ and emission $\lambda$ in nm.

FIG. 7 is a graph that shows the excitation and emission spectra of a commercial YAG:$Ce^{3+}$ phosphor compared with data for $Sr_{1.975}BaAlO_4F:Ce^{3+}_{0.025}$ at room temperature. The YAG:$Ce^{3+}$ phosphor shows an excitation band with a peak intensity at a wavelength $\lambda_{ex}$=450 nm and an emission band centered at a wavelength of $\lambda_{em}$=546 nm. The $Sr_{1.975}BaAlO_4F:Ce^{3+}_{0.025}$ phosphor of the present invention, on the other hand, has an excitation band with a peak intensity at a wavelength $\lambda_{ex}$=400 nm and an emission band centered at a wavelength $\lambda_{em}$=468 nm with an FWHM that is ~100 nm, or broader than the YAG:$Ce^{3+}$ phosphor's FWHM.

In this embodiment of the present invention, the raw materials of this phosphor are strontium carbonate ($SrCO_3$), barium carbonate ($BaCO_3$), barium fluoride ($BaF_2$), strontium fluoride ($SrF_2$), alumina ($Al_2O_3$), and cerium oxide ($CeO_2$) with stoichiometric amounts. The synthesis condition is the same as noted above.

The luminescent property of this $Sr_{1.975}BaAlO_4F:Ce^{3+}_{0.025}$ phosphor has a broad excitation band from 300 nm to 450 nm with a maximum at 400 nm, and their peaks were centered at 468 nm. The phosphor showed a higher PL intensity than commercial YAG:$Ce^{3+}$ phosphor. Due to the attractive properties of the phosphor, a white light emitting LED can be obtained by combining red or yellow-orange phosphors with this phosphor with high efficiency.

Third Embodiment

Figure 8:
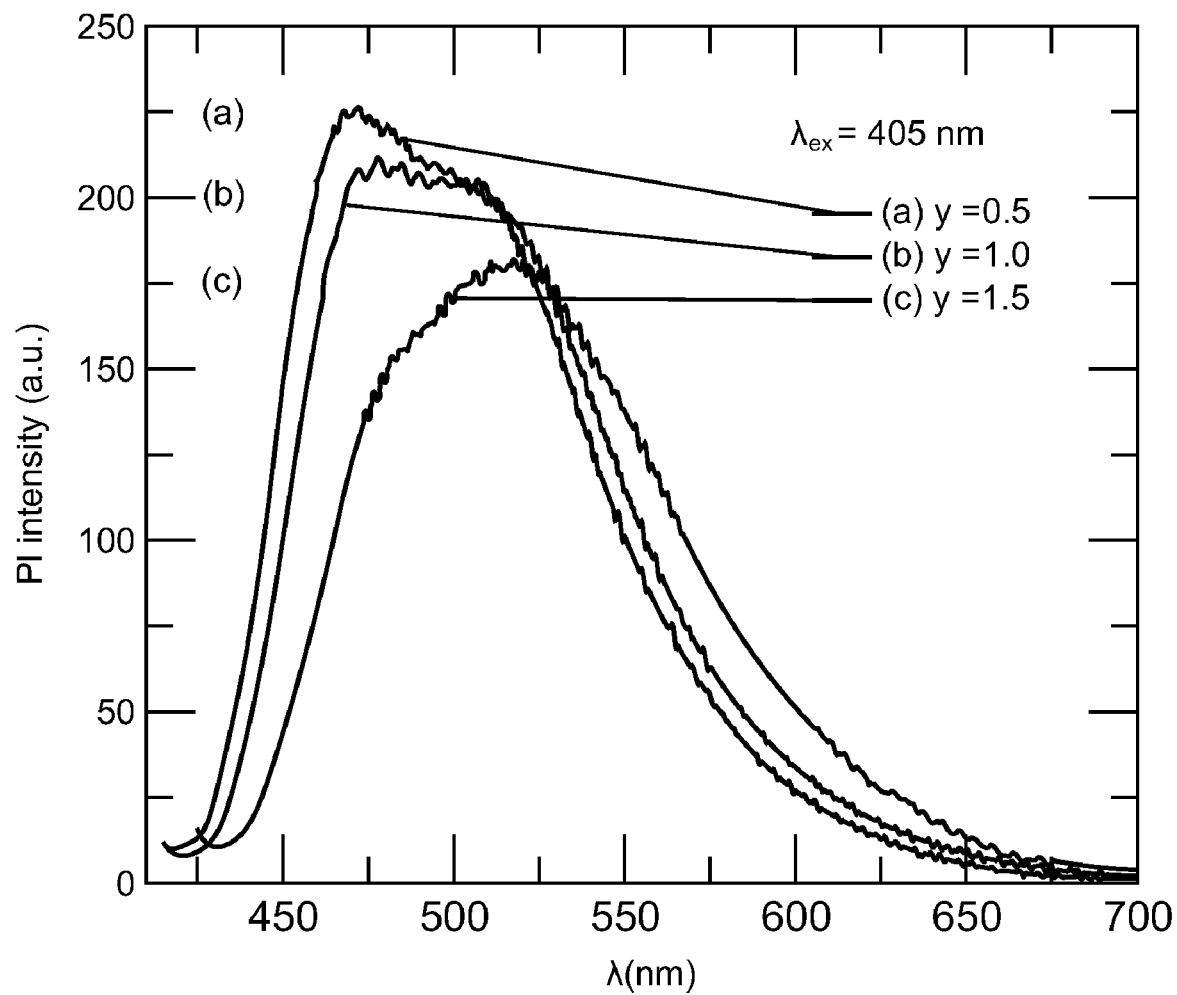
FIG. 8 is a graph that shows the emission spectra of $Sr_{2.975-y}Ca_yAlO_4F:Ce^{3+}_{0.025}$ at room temperature, wherein (a) y=0.5, (b) y=1.0, and (c) y=1.5, plotting PL intensity in a.u. as a function of emission wavelength ($\lambda$) in nanometers (nm), wherein the excitation wavelength is $\lambda_{ex}$=405 nm.

FIG. 8 is a graph that shows the emission spectra of $Sr_{2.975-y}Ca_yAlO_4F:Ce^{3+}_{0.025}$ at room temperature, wherein (a) y=0.5, (b) y=1.0, and (c) y=1.5.

In this embodiment of the present invention, the raw materials for this phosphor are strontium carbonate ($SrCO_3$), calcium carbonate ($CaCO_3$), calcium fluoride ($CaF_2$), strontium fluoride ($SrF_2$), alumina ($Al_2O_3$), and cerium oxide ($CeO_2$) with a stoichiometic amounts. The synthesis condition is the same as noted above.

The luminescent property of this $Sr_{2.975-y}Ca_yAlO_4F:Ce^{3+}{}_{0.025}$ phosphor has a maximum excitation band at 405 nm, and it displayed an emission band centered at 468 nm and 520 nm with a relatively broad FWHM value in comparison with the YAG:$Ce^{3+}$ phosphor. The relative of PL intensities for $Sr_{2.975-y}AE_yAlO_4F:Ce^{3+}{}_{0.025}$ are listed in Table 1, wherein the emission spectra of a commercial YAG:$Ce^{3+}$ phosphor are compared with data for $Sr_{2.975-y}AE_yAlO_4F:Ce^{3+}{}_{0.025}$ at room temperature. Specifically, the relative of PL intensities emitted from $Sr_{2.975-y}AE_yAlO_4F:Ce^{3+}{}_{0.025}$ are listed in Table 1 below, wherein the relative PL intensity data is the PL intensity of $Sr_{2.975-y}AE_yAlO_4F:Ce^{3+}{}_{0.025}$ divided by the PL intensity of YAG:$Ce^{3+}$ under 460 nm excitation, and multiplied by 100.

TABLE 1

Relative PL intensities of $Sr_{2.975-y}AE_yAlO_4F:Ce^{3+}{}_{0.025}$

| $Sr_{3-y}AE_yAlO_4F:$ | Relative PL intensity | |
|---|---|---|
| $Ce^{3+}{}_{0.025}$ (y) | Ba (=AE) | Ca (=AE) |
| 0 | 89% | 89% |
| 0.5 | 104% | 91% |
| 1 | 125% | 85% |
| 2 | 84% | 71% |
| 3 | 35% | 26% |

Figure 9:
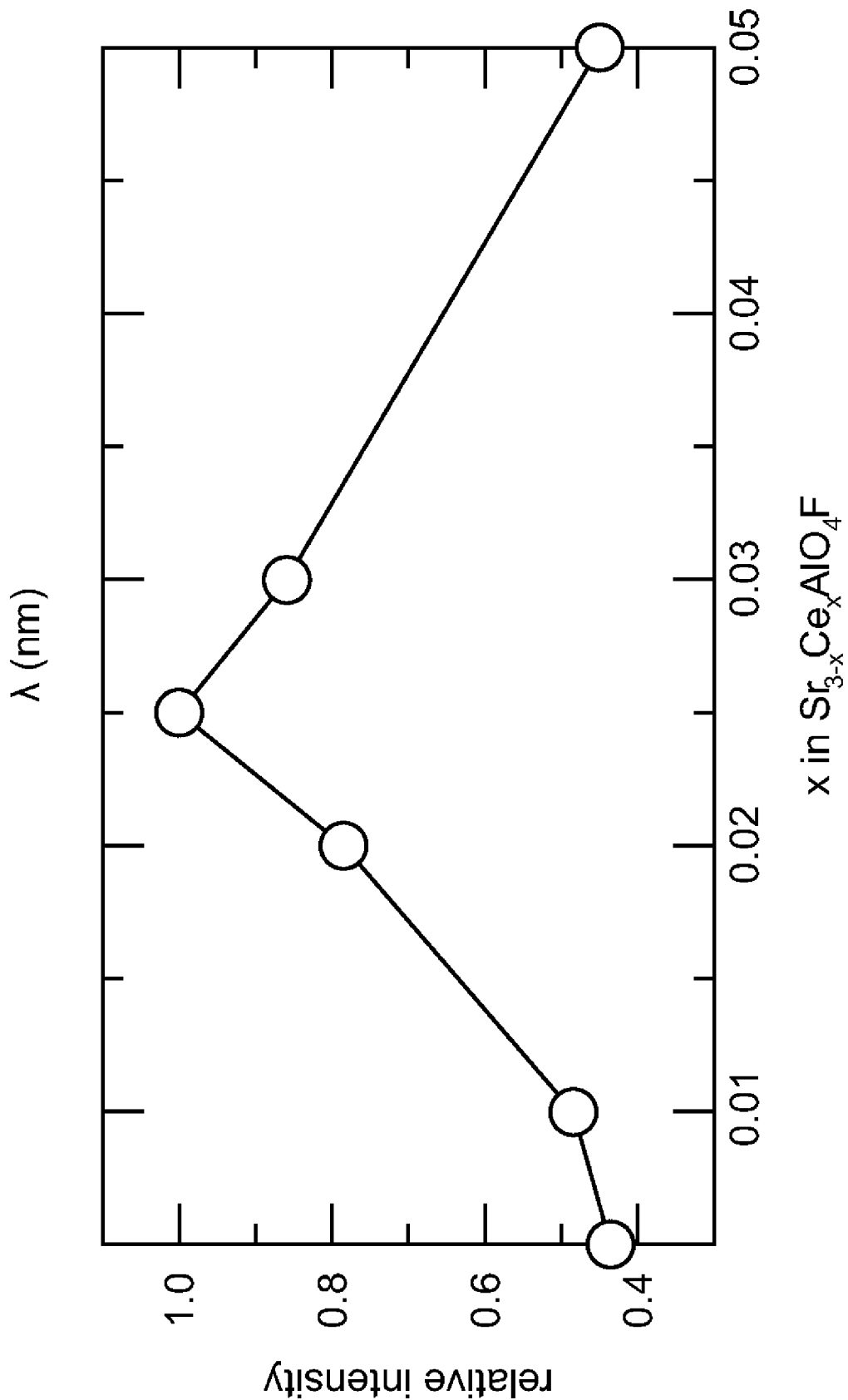
FIG. 9 plots relative PL intensity of light emitted from $Sr_{3-x}Ce_xAlO_4F$, as a function of x, for an excitation wavelength of 405 nm.

FIG. 9 illustrates that varying amounts of x in $Sr_{3-x}Ce_xAlO_4F$ may be used to tune the quantum efficiency or PL intensity of the phosphor.

Figure 10:
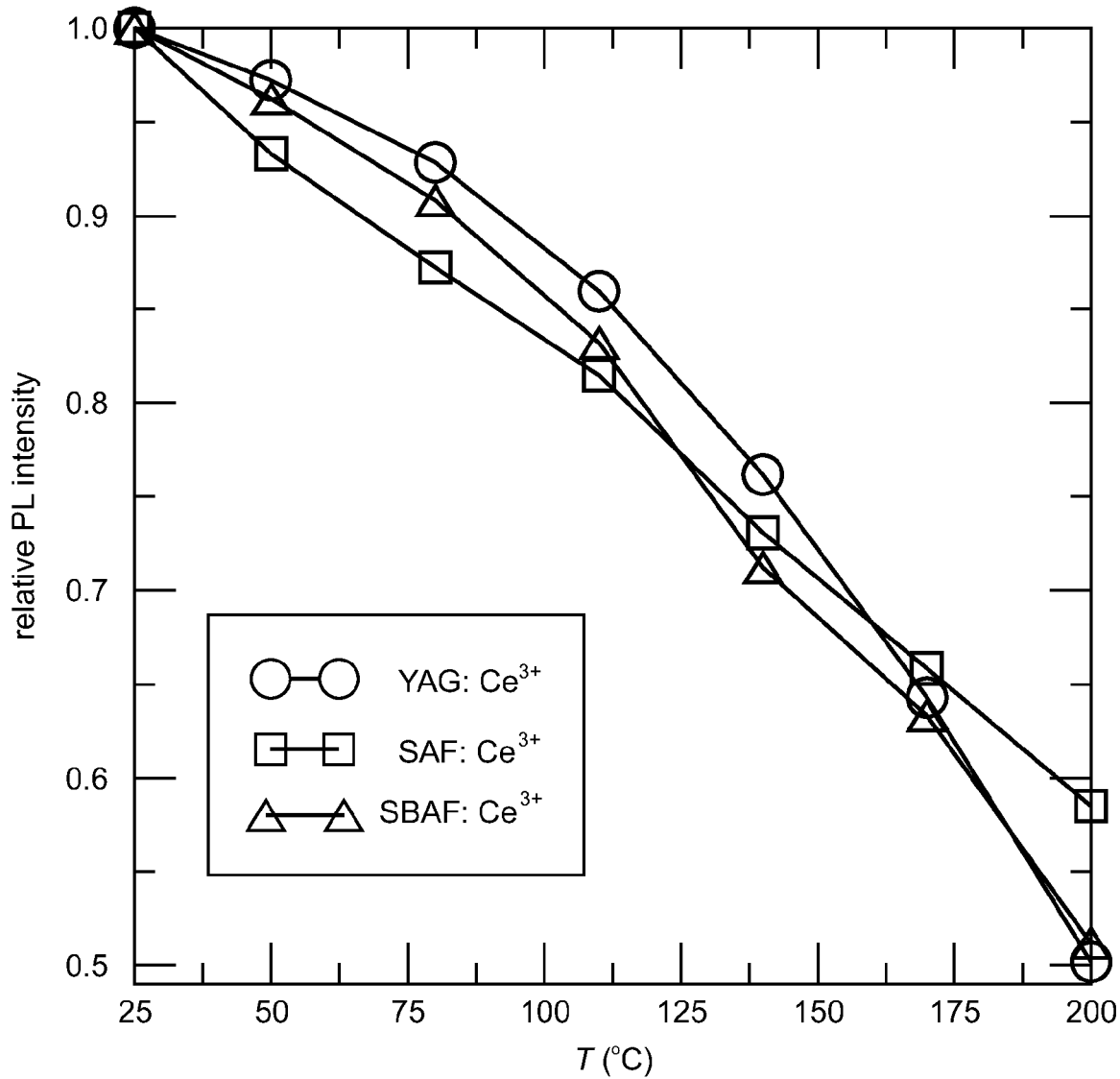
FIG. 10 shows thermal quenching of YAG:$Ce^{3+}$ (circles), SrAlF containing phosphor doped with $Ce^{3+}$ (SAF:$Ce^{3+}$) (squares), and SrBaAlF containing phosphor doped with $Ce^{3+}$ (SBAF:$Ce^{3+}$)(triangles), plotting relative PL intensity vs. Temperature in degrees Celsius (°).

FIG. 10 illustrates the phosphor of the present invention's thermal quenching properties, showing the phosphor can operate at the elevated temperatures produced when optically coupled to a powered LED.

The phosphor's emission and excitation spectra may be as shown in FIG. 6, FIG. 7, or FIG. 8.

Possible Modifications and Variations

As noted above, in the present invention, phosphor composition is made according to the formula below:

$$(Sr_{1-x-y}AE_y)_3(Al_{1-z}T_z)O_4F:Ce^{3+}{}_x$$

wherein, $0<x\leq0.3$, $0\leq y\leq1$, AE includes at least one element selected from alkaline earth metals on the periodic table, for example, Mg, Ca and Ba, $0\leq z\leq1$ and T includes at least one atom selected from Al, B, Ga, In, and Sc.

In particular, efficiency of a phosphor may be enhanced with adding another ion to a host lattice, wherein this ion may absorb the exciting radiation and subsequently transfer it to the activator. In this case the absorbing ion is called a sensitizer. In this regard, a small amount of Pr, Nd, Sm, Eu, Dy, Ho, Er, Tm, Yb, Lu, and Bi can be added to the host lattice as a sensitizer. Furthermore, the ions may be chosen from the group formed by $Li^+$, $Na^+$, and $K^+$ for charge compensation. As the method synthesis of the present invention, it is possible to apply various methods; including spray pyrolysis, co-precipitation, sol-gel method, solvothermal, hydrothermal method, etc.

As far as the white LED generation is concerned, the present invention also can be used with various combinations; either with a near-UV LED ($\lambda_{max}$=395 and 405 nm) and red emitting phosphor, or with a near-UV LED and green-orange phosphors, or with a near-UV LED and yellow phosphor. For this purpose, there are many numbers of different applications depending upon various color gamuts' needs.

Advantages and Improvements

In the present invention, both the composition and crystal structure of the phosphor $(Sr_{1-x-y}AE_y)_3(Al_{1-z}T_z)O_4F:Ce^{3+}{}_x$, are different from other reported blue-green emitting phosphors used under a near-UV excitation. The phosphor of the present invention is also expected to provide a good color rendering index, because it can be used with various combinations; including either with a near-UV LED ($\lambda_{max}$=395 and 405 nm) and red emitting phosphor, or with a near-UV LED and a green-orange phosphor, or with a near-UV LED and yellow phosphor, in order to provide a white light emitting LED. One advantage of the phosphor is that it shows much higher PL intensities than the commercial YAG:$Ce^{3+}$ phosphor.

For $Sr_{1.975}BaCe_{0.025}AlO_4F$, which has a color temperature 6900 K at 20 mA, the present invention obtained a color rendering index $R_a$ of about 62 [16]. Thus, the present invention may obtain $R_a$ of at least 62, for example through the addition of red components in the phosphor, the $R_a$ value of the LED improved up to 87 [16].

Further information on the present invention can be found in [16-18].

REFERENCES

The following references are incorporated by reference herein.

[1] D. Haranath, H. Chander, P. Sharma, S. Singh, Appl. Phys. Lett. 2006, 89, 173118.
[2] C.-H. Lu, R. Jagannathan, Appl. Phys. Lett. 2002, 80, 3608.
[3] R. Kasuya, A. Kawano, T. Isobe, H. Kuma, J. Katano, Appl. Phys. Lett. 2007, 91, 111916.
[4] International Patent Application No. PCT/JP1997/002610, filed Jul. 29, 1997, entitled "light emitting device and display device," published Feb. 5, 1998, publication No. WO/1998/005078, inventors Shimizu et. al., and applicant Nichia Chemical Industries.
[5] H. S. Jong, W. B. Im, D. C. Lee, D. Y. Jeon, S. S. Kim, J. Lumin. 2007, 126, 371.
[6] Y. Chen, M. Gong, G. Wang, Q. Su, Appl. Phys. Lett. 2007, 91, 071117.
[7] R.-J Xie, N. Hirosaki, K. Sakuma, Y. Yamamoto, M. Mitomo, Appl. Phys. Lett. 2004, 84, 5404.
[8] X. Piao, K. I. Machida, T. Horikawa, H. Hanzawa, Y. Shimomura, N. Kijima, Chem. Mater. 2007, 19, 4592.
[9] J. K Park, M. A. Lim, C. H. Kim, H. D. Park, J. T. Park, S. Y. Choi, Appl. Phys. Lett. 2003, 82, 683.
[10] Y. Q. Li, A. C. A. Delsing, G. de With, H. T. Hintzen, Chem. Mater. 2005, 17, 3242.
[11] M. P. Saradhi, U. V. Varadaraju, Chem. Mater. 2006, 18, 5267.
[12] W. B. Im, Y.-I. Kim, N. N. Fellows, H. Masui, G. A. Hirata, S. P. DenBaars, R. Seshadri, Appl. Phys. Lett. 2008, 93, 091905.
[13] T. Vogt, P. M. Woodward, B. A. Hunter, A. K. Prodjosantoso, and B. J. Kennedy, J. Solid State Chem. 1999, 144, 228.
[14] A. K. Prodjosantoso, and B. J. Kennedy, T. Vogt, and P. M. Woodward J. Solid State Chem. 2003, 172, 89.
[15] Greenham et. al., Chem. Phys Lett. 241, page 89 (1995).
[16] Won Bin Im, Stuart Brinkley, Jerry Hu, Steven P. DenBaars and Ram Seshadri, entitled "A green emitting phosphor: $Sr_{2.975-x}Ba_xCe_{0.025}AlO_4F$ with high quantum efficiency for solid state white lighting applications," Chem. Mater. 22 (9), pp 2842-2849 (2010).

[17] Presentation Slides entitled "New oxyfluoride phosphors for white LED," given by Won Bin Im at the 2009 Annual Review for Solid State Lighting and Energy Center (SSLEC), University of California, Santa Barbara (Nov. 5, 2009).

[18] Presentation Slides entitled "Novel Phosphors for Solid State Lighting," given by Ram Seshadri at the 2009 Annual Review for Solid State Lighting and Energy Center (SSLEC), University of California, Santa Barbara (Nov. 5, 2009).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus for solid state lighting applications, comprising:
   a light emitting diode (LED) for emitting light; and
   a phosphor optically coupled to the LED, wherein the phosphor comprises a $Ce^{3+}$-activated oxyfluoride phosphor represented as:

$(Sr_{1-x-y}AE_y)_3(Al_{1-z}T_z)O_4F: Ce^{3+}_x$ wherein $0<x\leq0.3$, $0\leq y\leq1$, AE includes at least one element selected from alkaline earth metals, $0\leq z\leq1$, and T includes at least one atom selected from Al, B, Ga, and In.

2. The apparatus of claim 1, wherein the elements selected from the alkaline earth metals comprise Mg, Ca and Ba.

3. The apparatus of claim 1, wherein the phosphor comprises a first phosphor that is mixed with a second phosphor to create a phosphor mixture that is optically coupled to the LED, and wherein the phosphor mixture absorbs the light emitted from the LED and emits a white light in response thereto.

4. The apparatus of claim 3, wherein the LED emits light in a near-ultraviolet (UV) wavelength, the first phosphor is a blue-green light emitting phosphor, and the second phosphor is a red light emitting phosphor.

5. The apparatus of claim 3, wherein the LED emits light in a near-ultraviolet (UV) wavelength, the first phosphor is a blue-green emitting phosphor, and the second phosphor is a yellow-red emitting phosphor.

6. The apparatus of claim 1, wherein the phosphor includes an absorbing ion as a sensitizer and charge compensator that absorbs exciting radiation and transfers it to an activator in the phosphor that emits light having a wavelength longer than a wavelength of the exciting radiation.

7. A method for creating a $Ce^{3+}$-activated oxyfluoride phosphor represented as:

$(Sr_{1-x-y}AE_y)_3(Al_{1-z}T_z)O_4F: Ce^{3+}_x$ wherein $0<x\leq0.3$, $0\leq y\leq1$, AE includes at least one element selected from alkaline earth metals, $0\leq z\leq1$, and T includes at least one atom selected from Al, B, Ga, and In,
   the method comprising the steps of:
   mixing stoichiometric amounts of carbonate or oxide of alkaline earth metals (AE), alumina ($Al_2O_3$), fluorine ($SrF_2$, $BaF_2$, $CaF_2$, $NH_4F$, $CeF_3$, $AlF_3$ and etc.), and cerium oxide ($CeO_2$) to create a mixture; and
   heating the mixture to create the $Ce^{3+}$-based oxyfluoride phosphor.

8. The method of claim 7, further comprising adding flux materials to the mixture.

9. The method of claim 7, wherein the heating step comprises heating the mixture to a temperature between 500° C. and 1700° C.

10. The method of claim 7, wherein the heating step comprises heating the mixture in a reduction atmosphere.

11. A phosphor composition, comprising:
    Sr, AE, Al, and F and doped with $Ce^{3+}$ as an activator, wherein:
    AE includes at least one element selected from alkaline earth metals, and
    the phosphor composition is represented as $(Sr_{1-x-y}AE_y)_3(Al_{1-z}T_z)O_4F: Ce^{3+}_x$
    $0<x\leq0.3$, $0\leq y\leq1$, $0\leq z\leq1$, and T includes at least one atom selected from Al, B, Ga, and In; and
    a structure and composition such that the phosphor composition emits blue-green light with a quantum efficiency when excited with violet, ultraviolet light or blue light, wherein the quantum efficiency is greater than a quantum efficiency of a YAG:$Ce^{3+}$ phosphor excited with the violet, the ultraviolet, or the blue light.

12. The phosphor composition of claim 11, wherein a photoluminescence (PL) intensity emitted by the phosphor composition, when excited by an LED emitting a peak intensity of light at a wavelength in response to a drive current, is greater than a PL intensity emitted by the YAG:Ce phosphor excited by the LED emitting the light having the wavelength in response to the drive current.

13. The phosphor composition of claim 11, wherein the luminous efficiency of the phosphor composition is at least 10 lm/W, when excited by an LED emitting a peak intensity of light at a wavelength in response to a drive current.

14. The phosphor composition of claim 11, wherein the elements selected from the alkaline earth metals comprise Mg, Ca and Ba.

15. The phosphor composition of claim 11, wherein x, y, and AE are such that the phosphor composition emits light having a peak intensity at a blue wavelength when excited by ultraviolet or blue radiation.

16. The phosphor composition of claim 11, wherein the phosphor composition emits light having a first peak intensity at a first wavelength between 450 and 500 nm, when excited by an LED emitting a second peak intensity of light at a second wavelength in response to a drive current, the phosphor composition emitting the light having the first wavelength with a full width at half maximum (FWHM) that is broader than a FWHM of light emitted by the YAG:$Ce^{3+}$ phosphor excited by the LED emitting the second peak intensity of light at the second wavelength in response to the drive current.

17. The phosphor composition of claim 11, wherein x, y, and AE are such that the phosphor composition emits light having a peak intensity at a blue-green wavelength when excited by ultraviolet or blue radiation.

18. The phosphor composition of claim 11, wherein x, y, and AE are such that the phosphor composition emits light having a peak intensity at a green wavelength when excited by ultraviolet or blue radiation.

* * * * *